(12) United States Patent
Kawakubo

(10) Patent No.: US 7,471,587 B2
(45) Date of Patent: Dec. 30, 2008

(54) SEMICONDUCTOR MEMORY

(75) Inventor: Tomohiro Kawakubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 56 days.

(21) Appl. No.: 11/797,256

(22) Filed: May 2, 2007

(65) Prior Publication Data
US 2007/0268768 A1 Nov. 22, 2007

(30) Foreign Application Priority Data
May 18, 2006 (JP) ............... 2006-138840

(51) Int. Cl.
*G11C 7/00* (2006.01)
(52) U.S. Cl. ............... 365/222; 365/230.03; 365/226
(58) Field of Classification Search ............ 365/222, 365/230.03, 226, 230.08
See application file for complete search history.

(56) References Cited
U.S. PATENT DOCUMENTS

| 5,208,779 | A | 5/1993 | Walther et al. |
| 5,566,119 | A | 10/1996 | Matano |
| 6,219,292 | B1 | 4/2001 | Jang |
| 6,438,055 | B1 | 8/2002 | Taguchi et al. |
| 7,042,785 | B2* | 5/2006 | Kim ............... 365/222 |
| 7,164,615 | B2* | 1/2007 | Park et al. ............... 365/222 |
| 2005/0259492 | A1 | 11/2005 | Fujioka et al. |

FOREIGN PATENT DOCUMENTS

| JP | 63-20798 A | 1/1988 |
| JP | 2005-332538 A | 12/2005 |
| KR | 10-0363107 B1 | 2/2003 |
| WO | WO 2005/119691 A1 | 12/2005 |

* cited by examiner

*Primary Examiner*—Connie C Yoha
(74) *Attorney, Agent, or Firm*—Arent Fox LLP

(57) ABSTRACT

A core control circuit outputs operation control signals to a memory core in order to perform refresh operations in response to an internal refresh request from a refresh request generating circuit and an external refresh request. The core control circuit sets the number of memory cells each subjected to the refresh operation in response to the external refresh request larger than the number of memory cells each subjected to the refresh operations in response to the internal refresh request. By relatively increasing the number of memory cells each subjected to the refresh operation in response to one external refresh request, the number of external refresh requests required to refresh all memory cells can be reduced. Accordingly, the frequency with which the external refresh request is supplied to the semiconductor memory can be lowered, which can improve access efficiency.

16 Claims, 10 Drawing Sheets

| CMD | CLK | /CE | /RF | /ADV | /WE |
|---|---|---|---|---|---|
| RD | ↱ | L | H | L | H |
| WR | ↱ | L | H | L | L |
| AREF | ↱ | L | L | H | L |
| SREN | ↱ | L | L | H | H |

SEMICONDUCTOR MEMORY

CROSS REFERENCE TO RELATED APPLICATION

This application is based upon and claims the benefit of priority from Japanese Patent Application No. 2006-138840, filed on May 18, 2006, the entire contents of which are incorporated herein by reference.

BACKGROUND OF THE INVENTION

1. Field of the Invention

The present invention relates to a semiconductor memory including DRAM memory cells and including an SRAM interface.

2. Description of the Related Art

A pseudo SRAM includes DRAM memory cells (dynamic memory cells) and operates as an SRAM by internally automatically performing a refresh operation of the memory cell. The pseudo SRAM performs the refresh operation without being recognized by a controller while a read operation and a write operation are not performed. To insert the refresh operation, for example, a read cycle time being a minimum supply interval of a read command is set to a value obtained by adding a refresh operation time to a read operation time. Further, to perform the refresh operation in priority to the read operation, a read access time from when the read command is supplied until read data is outputted includes the refresh operation time. The same goes for the write operation. As just described, in the conventional pseudo SRAM, the read cycle time and the write cycle time become longer, and thereby the data transfer rate decreases.

On the other hand, to increase the data transfer rate, a method of outputting a refresh request to the outside when the refresh request is generated inside the pseudo SRAM is proposed (for example, Japanese Unexamined Patent Application Publication No. 2005-332538). In this method, a controller which accesses the pseudo SRAM supplies an external refresh request to the pseudo SRAM in response to an internal refresh request from the pseudo SRAM. The pseudo SRAM performs the refresh operation in response to the external refresh request. The external refresh request is one of external access requests. Therefore, the refresh operation responsive to the external refresh request never contends with the read operation and the write operation. Accordingly, it becomes unnecessary to include the refresh operation time in a read operation cycle.

However, when the controller outputs the external refresh request in response to the internal refresh request from the pseudo SRAM, for example, the controller needs to interpose the external refresh request while the continuous read operation is being performed. By suspending the read operation at a timing not intended by the controller, the access efficiency drops.

SUMMARY OF THE INVENTION

An object of the present invention is to improve the access efficiency of a pseudo SRAM capable of receiving an external refresh request.

In a semiconductor memory of the present invention, a core control circuit outputs operation control signals to a memory core in order to perform refresh operations in response to an internal refresh request from a refresh request generating circuit and an external refresh request supplied from the outside of the semiconductor memory via an external refresh input circuit. The core control circuit sets the number of memory cells each subjected to the refresh operation in response to the external refresh request larger than the number of memory cells each subjected to the refresh operation in response to the internal refresh request. By relatively increasing the number of memory cells each subjected to the refresh operation in response to one external refresh request, the number of external refresh requests required to refresh all memory cells can be reduced. Accordingly, the frequency with which the external refresh request is supplied to the semiconductor memory can be lowered, which can improve access efficiency.

In the present invention, the access efficiency of a pseudo SRAM capable of receiving an external refresh request can be improved.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 is an explanatory diagram showing operation commands of an FCRAM shown in FIG. 1;

DESCRIPTION OF THE PREFERRED EMBODIMENTS

Figure 1:
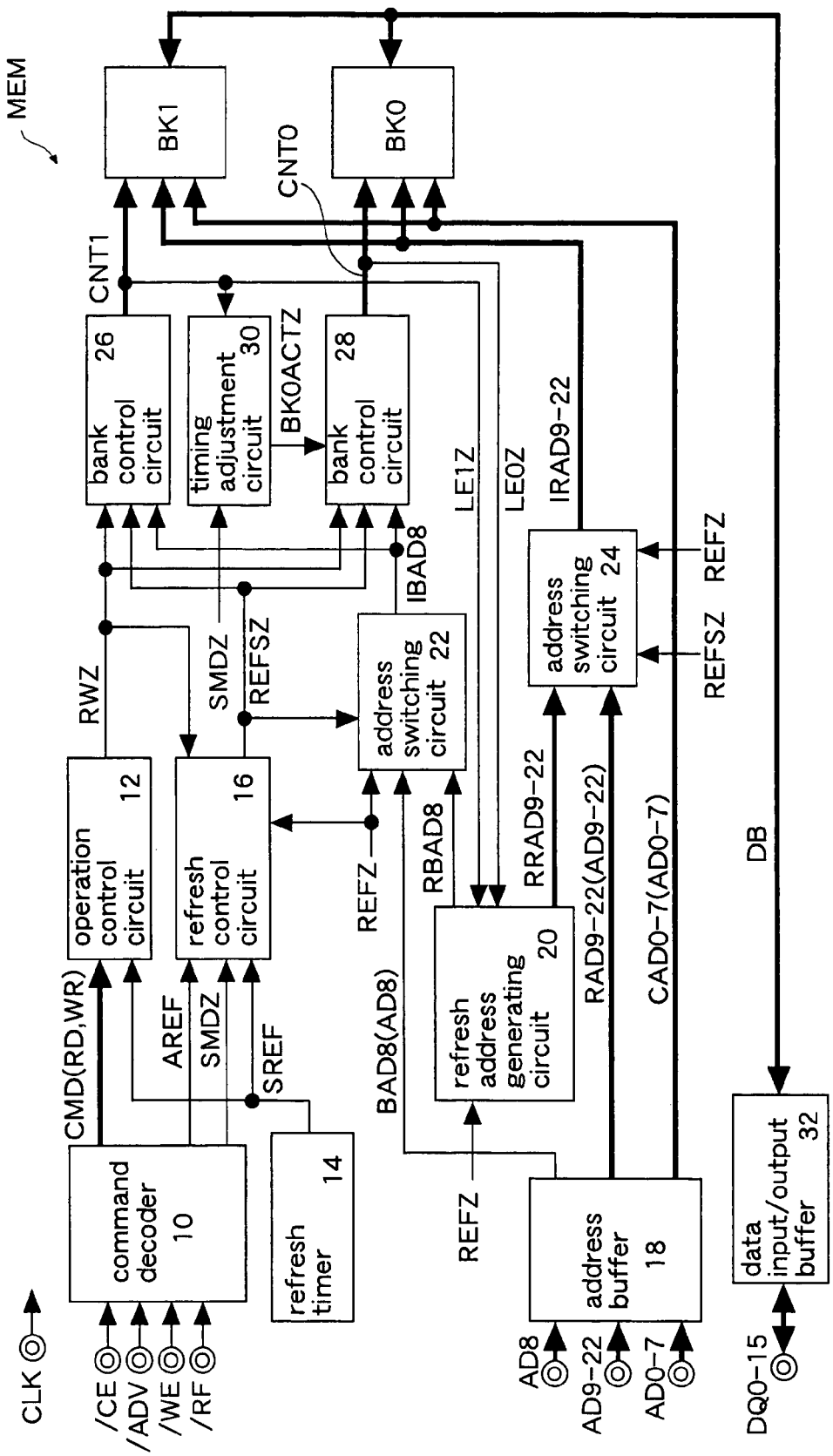
FIG. 1 is a block diagram showing a first embodiment of the present invention.

Hereinafter, embodiments of the present invention will be described, using the drawings. In the drawings, each signal line shown by a heavy line is constituted by a plurality of signal lines. Part of blocks to which the heavy lines are connected are constituted by a plurality of circuits. Each signal line through which a signal is transmitted is denoted by the same reference symbol as the name of the signal. Each signal with "/" at the head of its name indicates negative logic. Each signal with "Z" at the end of its name indicates positive logic. Each double circle in the drawings denotes an external terminal.

FIG. 1 shows a first embodiment of the present invention. A semiconductor memory MEM is, for example, a clock synchronous type FCRAM (Fast Cycle RAM) which operates in synchronization with an external clock CLK. The FCRAM is a pseudo SRAM including DRAM memory cells and including an SRAM interface. The memory MEM includes a command decoder 10, an operation control circuit 12, a refresh timer 14 (refresh request generating circuit), a refresh control circuit 16, an address buffer 18, a refresh address generating circuit 20, address switching circuits 22, 24, bank control circuits 26, 28, a timing adjustment circuit 30, a data input/output buffer 32, and banks BK0, BK1. The banks BK0, BK1 are a memory core including memory cells and circuits to input/output data to/from the memory cells. Details of the banks BK0-1 will be given in FIG. 4 described later. The FCRAM receives a clock CLK at a clock terminal and supplies the received clock CLK to respective circuit blocks via a clock buffer not shown.

The command decoder 10 outputs commands recognized according to logic levels of a chip enable signal /CE, an address valid signal /ADV, a write enable signal /WE, and an auto-refresh signal /RF as access commands CMD to perform access operations to the banks BK0-1. In the following description, for example, the chip enable signal /CE is occasionally abbreviated as a /CE signal, and the write enable signal /WE as a /WE signal. Among the access commands CMD, there are a read command RD, a write command WR, an auto-refresh command AREF, and so on. Details of the operation commands will be given in FIG. 5 described later.

A chip enable terminal /CE, an address valid terminal /ADV, a write enable terminal /WE, and an auto-refresh terminal /RF function as command terminals which receive the read command, the write command, and the auto-refresh command (external refresh request).

Namely, the command decoder 10 also operates as an external refresh input circuit which receives the external refresh request. Further, the command decoder 10 activates a self refresh mode signal SMDZ during a self refresh mode (internal refresh mode), and inactivates the self refresh mode signal SMDZ during an auto-refresh mode (external refresh mode). When receiving the auto-refresh command AREF during the self refresh mode, the command decoder 10 also functions as a mode switching circuit which switches an operation mode from the self refresh mode to the auto-refresh mode in response to the auto-refresh command AREF. Details of the self refresh mode and the auto-refresh mode will be given in FIG. 6 described later.

The operation control circuit 12 outputs a read/write signal RWZ as a basic timing signal to perform a read operation and a write operation in the banks BK0-1 in response to the read command RD and the write command WR. The operation control circuit 12 includes an arbiter not shown to determine priority between the read command RD and the write command WR, and a self refresh request SREF. For example, when receiving the read command RD and the self refresh request SREF at the same time, the operation control circuit 12 gives priority to the self refresh request SREF. The read command RD is temporarily held and an output of the read/write signal RWZ is disabled until a refresh operation responsive to the refresh request SREF is completed. Incidentally, occasionally, plural read commands RD or write commands WR are continuously supplied, or a burst read operation or a burst write operation is performed, and thereby the refresh operation responsive to the self refresh request SREF cannot be performed. In such a case, as will be described later in FIG. 2, the self refresh request SREF is temporarily held by the refresh control circuit 16.

The refresh timer 14 includes an oscillator which generates the self refresh request SREF (internal refresh request) in a predetermined cycle. The refresh control circuit 16 masks the self refresh request SREF during the auto-refresh mode and outputs a refresh start signal REFSZ in response to the auto-refresh command AREF. Further, the refresh control circuit 16 outputs the refresh start signal REFSZ in response to the self refresh request SREF. Details of the refresh control circuit 16 will be given in FIG. 2 described later.

The address buffer 18 receives an address AD0-22 and outputs the received address as a column address CAD0-7 (AD0-7), a row address RAD9-22 (AD9-22), and a bank address BAD8 (AD8). The column address CAD0-7 is supplied to select a bit line pair BL, /BL. The row address RAD9-22 is supplied to select a word line WL. The bank address BAD8 is supplied to select the bank BK0-1. The FCRAM of this embodiment is an address non-multiplex type semiconductor memory which receives the column address CAD0-7, the row address RAD9-22, and the bank address BAD8 at address terminals AD different from one another at a time.

The refresh address generating circuit 20 sequentially generates a refresh bank address RBAD8 and a refresh row address RRAD9-22 in synchronization with a sense amplifier activating signal LE0Z, LE1Z to operate a sense amplifier SA described later while the refresh operation is performed in the bank BK0-1. Namely, the refresh row address RRAD9-22 and the refresh bank address RBAD8 are sequentially updated every time the refresh operation is performed in either of the banks BK0-1. A refresh signal REFZ is a signal obtained by the OR logic of signals activated by the bank BK0-1 during the refresh operation. The refresh bank address RBAD8 is an internal address to select the bank BK0-1 where the refresh operation is performed. The refresh row address RRAD9-22 is an address to select the word line WL of each bank BK0-1. Details of the refresh address generating circuit 20 will be given in FIG. 3 described later.

The address switching circuit 22 outputs the bank address signal BAD8 as an internal bank address IBAD8 when both the refresh start signal REFSZ and the refresh signal REFZ are inactivated, and outputs the refresh bank address RBAD8 as the internal bank address IBAD8 during activation of the refresh start signal REFSZ or the refresh signal REFZ. The address switching circuit 24 outputs the row address RAD9-22 as an internal row address IRAD9-22 when both the refresh start signal REFSZ and the refresh signal REFZ are inactivated, and outputs the refresh row address RRAD9-22 as the internal row address IRAD9-22 during the activation of the refresh start signal REFSZ or the refresh signal REFZ. Consequently, the read operation and the write operation are performed in response to the external address AD received at the address terminals AD, and the self refresh operation and the auto-refresh operation are performed in response to the internal addresses RRAD9-22, RBAD8 generated by the refresh address generating circuit 20.

To control access to the bank BK1, the bank control circuit 26 (first bank control circuit) outputs an operation control signal CNT1 in synchronization with the read/write signal RWZ or the refresh start signal REFSZ when the internal bank address IBAD8 is at a high logic level. To control access to the bank BK0, the bank control circuit 28 (second bank control circuit) outputs an operation control signal CNT0 in synchronization with the read/write signal RWZ, the refresh start signal REFSZ, or a timing signal BK0ACTZ when the internal bank address IBAD 8 is at a low logic level.

Figure 4:
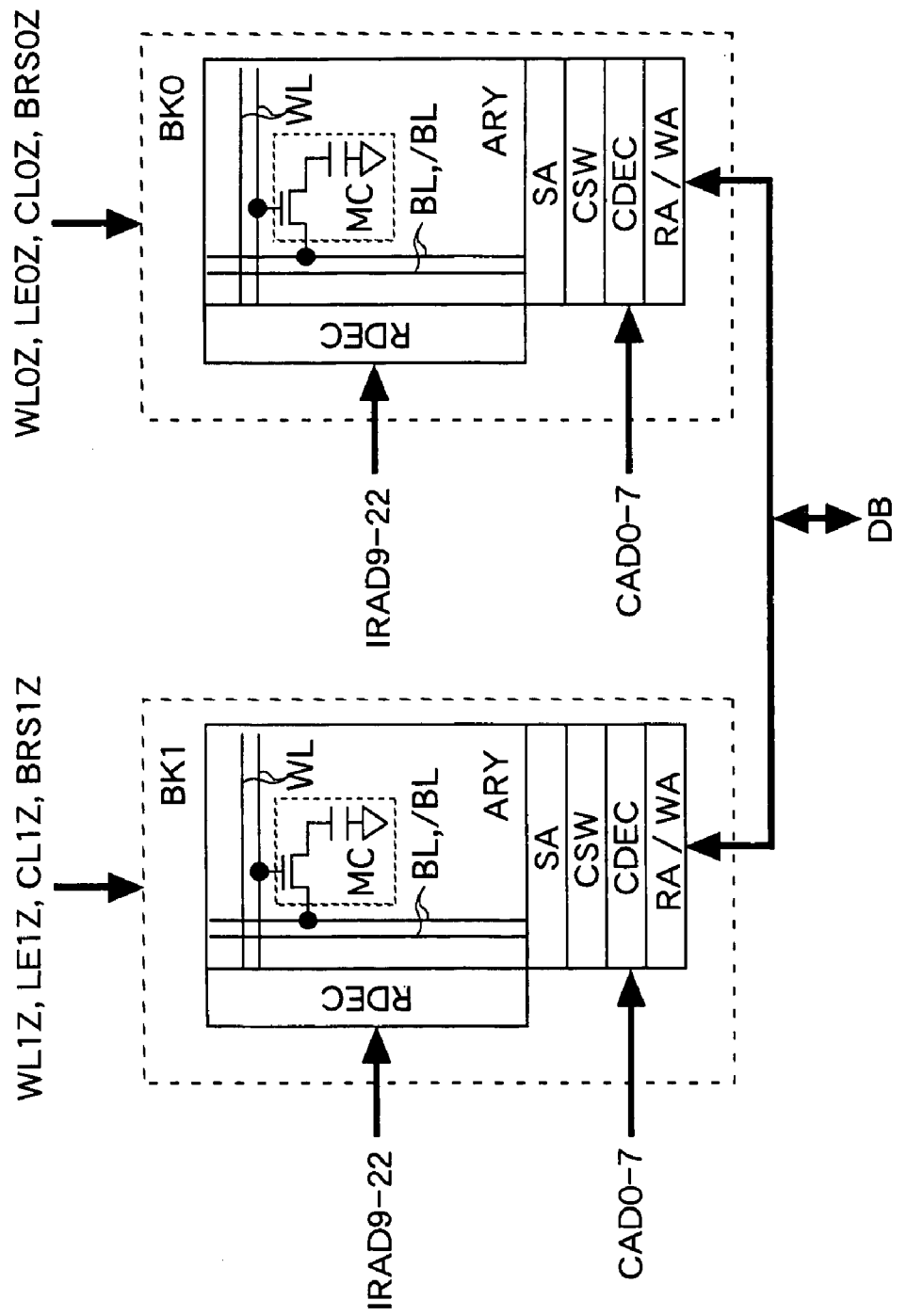
FIG. 4 is a block diagram showing details of banks BK0-1 shown in FIG. 1.

As shown in FIG. 4 described later, the respective operation control signals CNT0-1 include word line activating signals WL0Z, WL1Z each to determine an activation timing of the word line WL, the sense amplifier activating signals LE0Z, LE1Z each to determine an activation timing of the sense amplifier SA, column selecting signals CL0Z, CL1Z each to determine an on-timing of a column switch CSW, bit line reset signals BRS0Z, BRS1Z each to determine a precharge timing of the bit line pair BL, /BL. Output timings of the operation control signals CNT0-1 may be the same or different among the read operation, the write operation, and the refresh operation.

The timing adjustment circuit 30 outputs the sense amplifier activating signal LE1Z outputted from the bank control circuit 26 as the timing signal BK0ACTZ to the bank control circuit 28 during the auto-refresh mode (SMDZ signal=low logic level). The timing adjustment circuit 30 stops the output of the timing signal BK0ACTZ corresponding to the sense amplifier activating signal LE1Z outputted from the bank control circuit 26 to the bank control circuit 28 during the self refresh mode (SMDZ signal=high logic level). When the refresh operation is performed in the bank BK1 during the auto-refresh mode by the operation of the timing adjustment circuit 30, the refresh operation in the bank BK0 is started in synchronization with a timing when the sense amplifier SA of the bank BK1 is activated.

Thus, the auto-refresh operation is performed in the banks BK1, BK0 for each auto-refresh command AREF except when the refresh bank address RBAD8 shows the bank BK0. The self refresh operation is performed in either of the banks BK0-1 for each self-refresh request SREF. Therefore, the number of memory cells refreshed by the auto-refresh operation becomes twice that of memory cells refreshed by the self refresh operation.

The bank control circuits 26, 28 and the timing adjustment circuit 30 operate as a core control circuit which outputs the operation control signals CNT0-1 to the banks BK0-1 in response to the self refresh request SREF and the auto-refresh command AREF. In other words, the core control circuit outputs the operation control signal CNT to either of the banks BK0-1 in response to the self refresh request SREF, and outputs the operation control signal CNT to the bank BK0 or both of the banks BK0-1 in response to the auto-refresh command AREF. Further, as described above, the core control circuit sets the number of memory cells MC subjected to the refresh operation in response to the auto-refresh command AREF to twice the number of the memory cells MC subjected to the refresh operation in response to the self refresh request SREF. Details of the refresh operation will be given in FIG. 6 and FIG. 7 described later.

The data input/output buffer 32 receives write data via a data terminal DQ and outputs the received data to a data bus DB. Further, the data input/output buffer 32 receives read data from the memory cell MC via the data bus DB and outputs the received data to the data terminal DQ.

In this embodiment, a read cycle time (external access cycle time) being a specification of a minimum supply interval of the read command is set longer than one read operation time of each bank BK0-1. Similarly, a write cycle time (external access cycle time) being a specification of a minimum supply interval of the write command is set longer than one write operation time of each bank BK0-1. Namely, the external access cycle time is equal to a value obtained by adding a margin time to the read operation time (write operation time) of the bank BK0-1. The read cycle time and the write cycle time are equal to each other, and the read operation time and the write operation time are equal to each other. The actual refresh operation time of each bank BK0-1 is almost half the read operation time and the write operation time.

When the self refresh request SREF and the read command or the write command contend, the self refresh operation is performed using the above margin time. Concretely speaking, for example, the read cycle time is one and a half times the read operation time, and the write cycle time is one and a half times the write operation time. At this time, the margin time is half the read operation time (write operation time). Hence, for example, also when the refresh operation is performed in priority to the read operation, the time to perform one self refresh operation can be secured by performing one read cycle including the margin time which is half the read operation. In other words, a delay of the read operation with respect to the read command RD caused because priority is given to the refresh operation can be hidden in one read cycle time.

Incidentally, during the auto-refresh mode in which the refresh operation is performed in response to only the auto-refresh command AREF, the insertion timing of the refresh operation is controlled by a controller. Therefore, the read cycle time and the write cycle time need not include the above margin time. Namely, the read cycle time and the write cycle time can be made equal to the read operation time and the write operation time. Consequently, the read cycle time and the write cycle time during the auto-refresh mode can be shortened, which can improve access efficiency.

Figure 2:
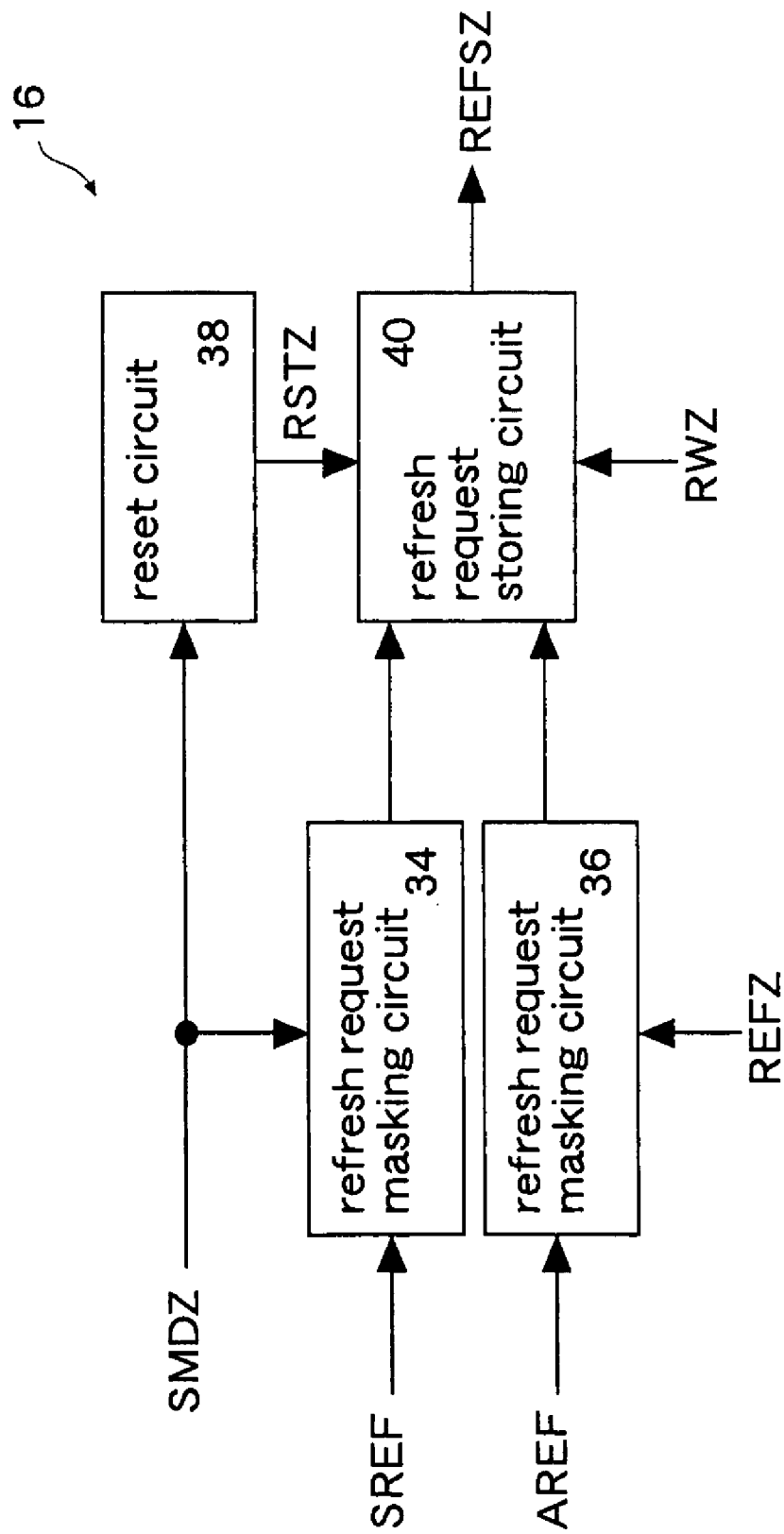
FIG. 2 is a block diagram showing details of a refresh control circuit 16 shown in FIG. 1.

FIG. 2 shows the details of the refresh control circuit 16 shown in FIG. 1. The refresh control circuit 16 includes refresh request masking circuits 34, 36, a reset circuit 38, and a refresh request storing circuit 40.

The refresh request masking circuit 34 (internal request masking circuit) outputs the self refresh request SREF to the refresh request storing circuit 40 during the activation of the self refresh mode signal SMDZ (self refresh mode), and disables the output of the self refresh request SREF during the inactivation of the self refresh mode signal SMDZ (auto-refresh mode). This can prevent the refresh operation responsive to the self refresh request SREF from being performed during the auto-refresh mode. The self refresh request SREF whose output is disabled is erased without being held. During the auto-refresh mode, the auto-refresh command AREF is cyclically supplied by a controller which accesses the FCRAM. Therefore, even if the self refresh request SREF is erased, data held in the memory cell MC never disappears.

The refresh request masking circuit 36 (external request masking circuit) outputs the auto-refresh command AREF to the refresh request storing circuit 40. Note, however, that the refresh request masking circuit 36 disables the output of the auto-refresh command AREF while the self refresh operation is being performed (REFZ signal=high logic level). Hence, when the auto-refresh command AREF is supplied while the self refresh operation is being performed to thereby shift the operation mode from the self refresh mode to the auto-refresh mode, the auto-refresh command AREF is ignored. Therefore, for example, when the self refresh request SREF contends with the read command RD and the read operation is performed after the self refresh operation, the read operation can be prevented from being further delayed by the auto-refresh operation. Incidentally, even if the auto-refresh command AREF is cancelled, the self refresh operation is performed at the same timing, so that data held in the memory cell MC never disappears.

The reset circuit 38 activates a reset signal RSTZ in synchronization with the inactivation (falling edge) of the self refresh mode signal SMDZ. Namely, the reset signal RSTZ is outputted every time the auto-refresh mode is entered.

The refresh request storing circuit 40 outputs the refresh start signal REFSZ in response to the self refresh request SREF and the auto-refresh command AREF. Further, the refresh request storing circuit 40 stores the self refresh request SREF when the self refresh operation cannot be performed due to continuous performance of read operations or write operations or when the self-refresh operation cannot be performed due to a burst read operation or a burst write operation. The refresh request storing circuit 40, for example, includes a 5-bit counter and can store 32 self refresh requests SREF.

The refresh request storing circuit 40 sequentially outputs the stored self refresh requests SREF during a standby period when the read operation or the write operation is not performed. The performance period of the read operation or the write operation is determined by the read/write signal RWZ. The stored self refresh requests SREF are decremented by one in response to the output of the refresh start signal REFSZ.

Further, the refresh request storing circuit 40 erases all the stored self refresh requests SREF in response to the activation of the reset signal RSTZ. By erasing the self refresh requests SREF stored in the refresh request storing circuit 40 when the operation mode switches from the self refresh mode to the auto-refresh mode, the self refresh operation responsive to the self refresh request SREF is prevented from being performed during the auto-refresh mode. The self refresh operation to be performed at a timing which cannot be controlled by the controller accessing the FCRAM is not performed, so that the read cycle time and the write cycle time can be minimized as described above.

Figure 3:
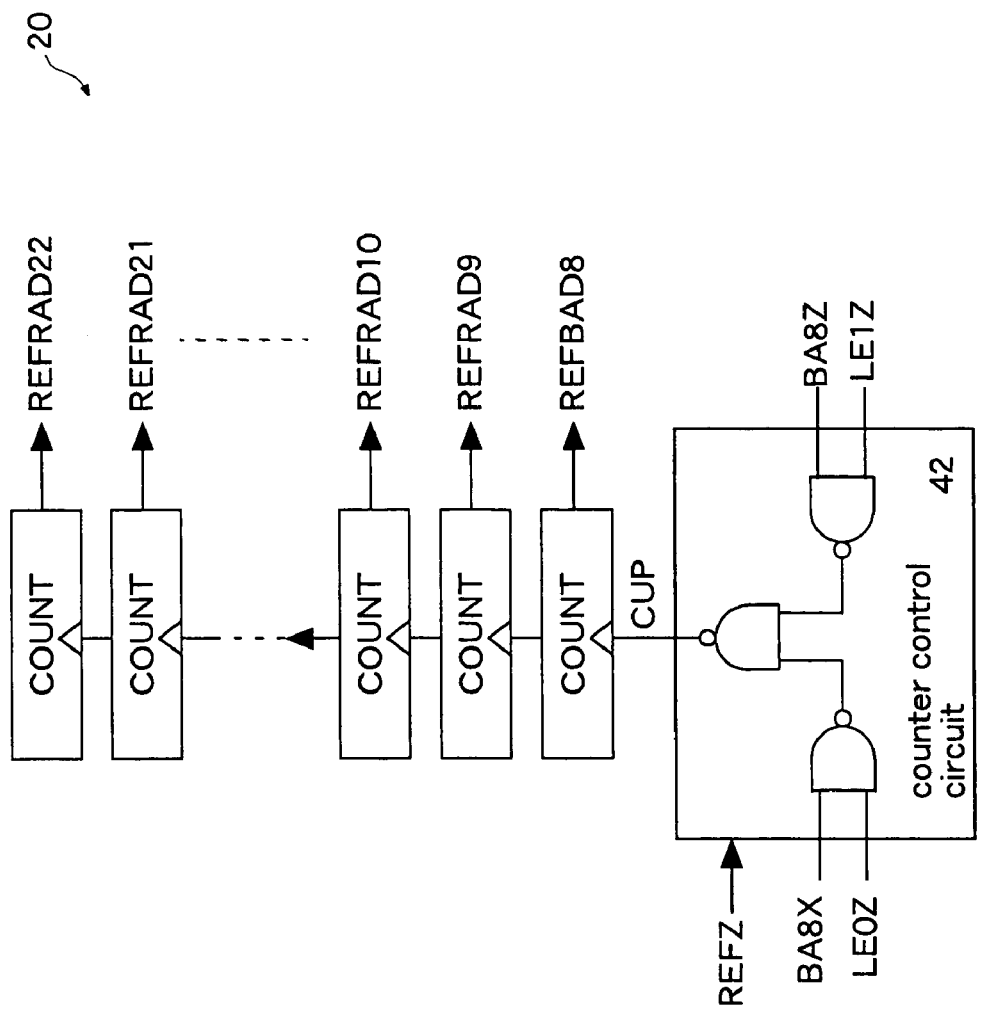
FIG. 3 is a block diagram showing details of a refresh address generating circuit 20 shown in FIG. 1.

FIG. 3 shows the details of the refresh address generating circuit 20 shown in FIG. 1. The refresh address generating circuit 20 includes a counter control circuit 42 and 15 binary counters COUNT connected in series. The counter control circuit 42 generates a count-up signal CUP (positive pulse signal) in response to the refresh operation in the bank BK0-1.

The refresh operation in the bank BK0-1 is detected by the sense amplifier activating signal LE0Z, LE1Z and bank address signal BA8Z, BA8X. The bank address signal BA8Z changes to a high logic level when the bank address BAD8 is at a high logic level. The bank address signal BA8X changes to a high logic level when the bank address BAD8 is at a low logic level.

The first-stage counter COUNT performs a count operation in synchronization with the rising edge of the count-up signal CUP. The second and subsequent stage counters COUNT each perform a count operation in synchronization with the rising edge of an output signal from the preceding stage counter COUNT. The first-stage counter COUNT outputs the refresh bank address RBAD8, and the second and subsequent stage counters COUNT output the refresh row address RRAD9-22, respectively. By the refresh address generating circuit 20, the refresh bank address RBAD8 is updated every time the refresh operation in the bank BK0-1 is performed, and the refresh row address RRAD9-22 is sequentially updated every time the refresh bank address RBAD8 takes a round.

FIG. 4 shows the details of the banks BK0-1 shown in FIG. 1. The banks BK0-1 have the same constitution and operate independently of each other. Each bank BK0-1 includes a row address decoder RDEC, a column address decoder CDEC, a sense amplifier SA, a column switch CSW, a read amplifier RA, a write amplifier WA, and a memory cell array ARY. The memory cell array ARY includes dynamic memory cells MC, word lines WL and bit line pairs BL, /BL connected to the dynamic memory cells MC. The memory cell MC is formed at a portion where the word line WL and the bit lint pair BL, /BL intersect each other.

The row address decoder RDEC decodes the row address IRAD9-22 to select any of the word lines WL. The row address decoder RDEC activates any of the word lines WL in synchronization with the word line activating signal WL1Z (or WL0Z). The activation level (high level) of the word line WL is a boost voltage higher than a power supply voltage. Therefore, the FCRAM includes a boosting circuit not shown to generate the boost voltage. The column address decoder CDEC decodes the column address CAD0-7 to select the bit line pair BL, /BL. The sense amplifier SA is activated in synchronization with the sense amplifier activating signal LE1Z (or LE0Z) and amplifies a difference in signal amount between data signals read from the bit line pair BL, /BL.

The column switch CSW connects the bit line pair BL, /BL corresponding to the column address CAD to the read amplifier RA and the write amplifier WA in synchronization with the column selecting signal CL1Z (or CL0Z). The bit line pair BL, /BL is set to a precharge voltage while the bit line reset signal BRS1Z (or BRS0Z) is at a high logic level. The read amplifier RA amplifies complementary read data outputted via the column switch CSW during a read access operation. The write amplifier WA amplifies complementary write data supplied via the data bus DB and supplies it to the bit line pair BL, /BL during a write access operation.

The bank control circuit 26 shown in FIG. 1 sequentially activates the WL1Z signal, the LE1Z signal, and the CL1Z signal in response to the RWZ signal, the REFSZ signal. Similarly, the bank control signal 28 sequentially activates the WL0Z signal, the LE0Z signal, and the CL0Z signal in response to the RWZ signal, the REFSZ signal, or the BK0ACTZ signal. Namely, the LE1Z signal is generated from the WL1Z signal, and the LE0Z signal is generated from the WL0Z signal.

FIG. 5 shows operation commands of the FCRAM shown in FIG. 1. The command decoder 10 shown in FIG. 1 receives logic levels of the /CE signal, the /RF signal, the /ADV signal, and the /WE signal in synchronization with the rising edge of the clock CLK and determines respective operation commands. The read command RD is recognized at the time of the low logic level (L) of the /CE signal, the high logic level (H) of the /RF signal, the low logic level (L) of the /ADV signal, and the high logic level (H) of the /WE signal. The write command WR is recognized when the logic levels of the /CE signal, the /RF signal, the/ADV signal, and the /WE signal are L, H, L, L.

The auto-refresh command AREF is recognized when the logic levels of the /CE signal, the /RF signal, the /ADV signal, and the /WE signal are L, L, H, L. When the auto-refresh command AREF is supplied during the self refresh mode, the operation mode switches to the auto-refresh mode. Namely, the auto-refresh command AREF also serves as an entry command to the auto-refresh mode. A self refresh enable command SREN is recognized when the logic levels of the /CE signal, the /RF signal, the /ADV signal, and the /WE signal are L, L, H, H. The self refresh enable command SREN is supplied when the operation mode returns to the self refresh mode during the auto-refresh mode.

Figure 6:
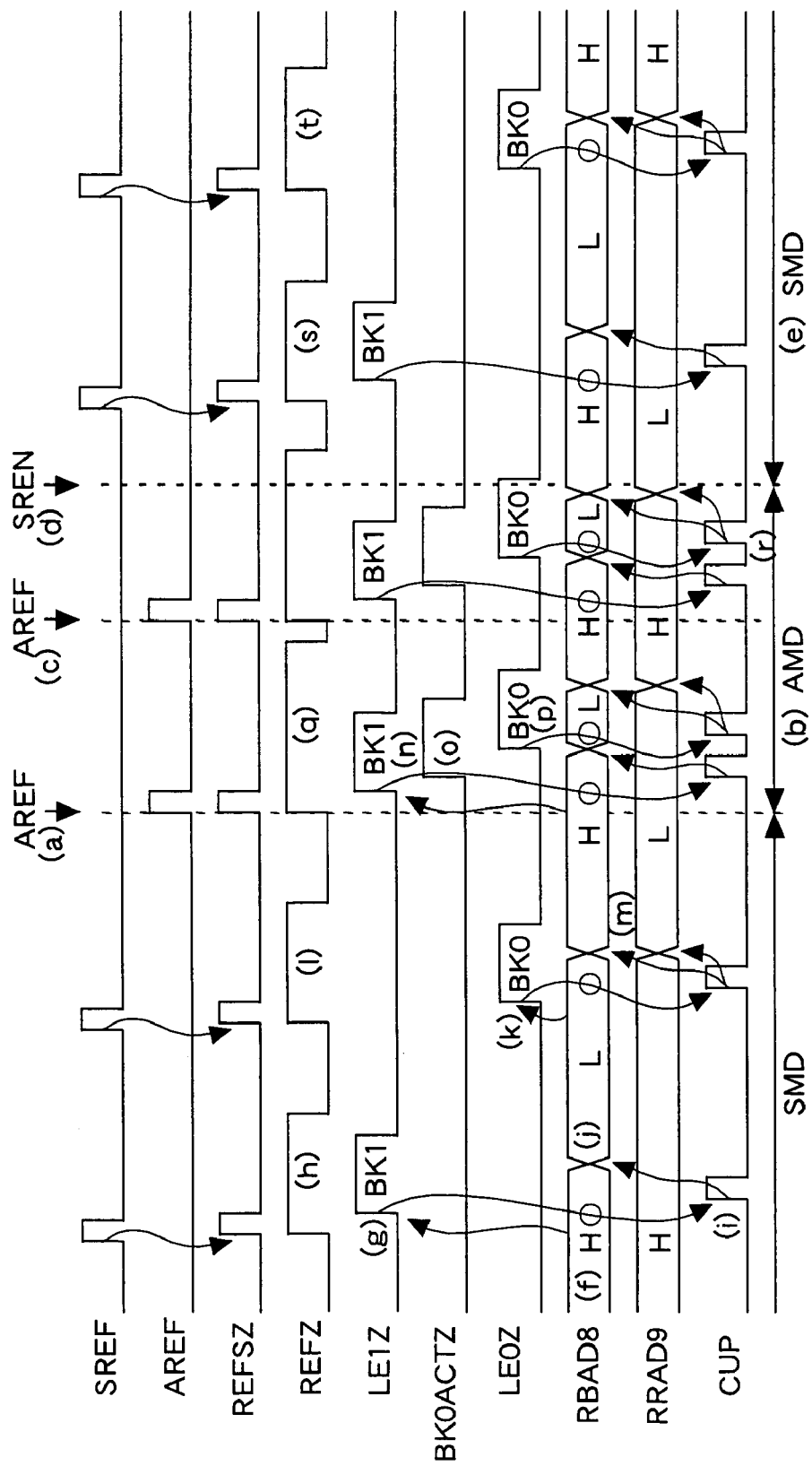
FIG. 6 is a timing chart showing an example of refresh operations in the first embodiment.

FIG. 6 shows an example of refresh operations in the first embodiment. In this embodiment, the generation cycle of the self refresh request SREF and the average supply interval of the auto-refresh command AREF are 2 μs. In FIG. 6, during the self refresh mode SMD, the auto-refresh command AREF is supplied (FIG. 6($a$)), and the operation mode switches to the auto-refresh mode AMD (FIG. 6($b$)). The auto-refresh mode AMD is a period from when the auto-refresh command AREF is received during the self-refresh mode SMD until the self refresh enable command SREN is received. In this example, after the second auto-refresh command AREF is supplied (FIG. 6($c$)), the self refresh enable command SREN is supplied (FIG. 6($d$)). Then, the operation mode returns again to the self refresh mode SMD (FIG. 6($e$)).

When the first self refresh mode request SREF is generated, the refresh address generating circuit 20 is outputting the refresh bank address RBAD8 of the high logic level H (FIG. 6($f$)). Therefore, the bank control circuit 26 corresponding to the bank BK1 operates, and the LE1Z signal is activated (FIG. 6($g$)). Then, the self refresh operation in the bank BK1 is performed during the activation period of the refresh signal REFZ (FIG. 6(h)). The refresh address generating circuit 20 counts up in response to the LE1Z signal (FIG. 6(i)), and changes the refresh bank address RBAD8 to the low logic level L (FIG. 6(j)).

When the next self refresh mode request SREF is generated, the refresh bank address RBAD8 is at the low logic level L. Therefore, the bank control circuit 28 corresponding to the bank BK0 operates, and the LE0Z signal is activated (FIG. 6(k)). During the activation period of the REFZ signal, the self refresh operation in the bank BK0 is performed (FIG. 6(l)). The refresh address generating circuit 20 counts up in response to the LE0Z signal and changes the refresh band address RBAD8 and the refresh row address RRAD9 to the high logic level H and the low logic level L, respectively (FIG. 6(m)).

When the auto-refresh command AREF is next supplied, the operation mode switches from the self refresh mode SMD to the auto-refresh mode AMD. The refresh control circuit 16 masks the self refresh request SREF from the refresh timer 14. This can prevent the refresh operation from being performed in response to the self refresh request SREF without stopping the refresh timer 14. By disabling the refresh operation responsive to the self refresh request SREF during the auto-refresh mode, the read operation and the write operation can be prevented from being delayed by the self refresh operation. Accordingly, a drop in access efficiency can be prevented.

When the auto-refresh command AREF is supplied, the refresh bank address RBAD8 is at the high logic level H. Therefore, the bank control circuit 26 corresponding to the bank BK1 operates, and the LE1Z signal is activated (FIG. 6(n)). Because of the auto-refresh mode AMD, the BK0ACTZ signal is activated in response to the LE1Z signal (FIG. 6(o)). In synchronization with the BK0ACTZ signal, the bank control circuit 28 sequentially activates the WL0Z, the LE0Z signal, the CL0Z signal, and so on (FIG. 6(p)).

In the auto-refresh mode AMD, in response to the auto-refresh command AREF, the LE1Z signal and the LE0Z signal are sequentially outputted, respectively, in synchronization with changes of the refresh bank address RBAD8 until the value of the least significant bit RRAD9 of the refresh row address changes. This operation is realized by the refresh address generating circuit 20, the bank control circuits 26, 28, and the timing adjustment circuit 30. By these circuits, the refresh bank address RBAD8 always becomes the high logic level H after the auto-refresh operation. Accordingly, even where the number of memory cells MC refreshed at a time differs between the operation modes SMD, AMD, the common refresh addresses RBAD8, RRAD9-22 can be generated using the common refresh address generating circuit 20. In particular, by counting up the refresh address generating circuit 20 using the LE1Z, LE0Z signals being the operation control signals to operate the banks BK1, BK0, the refresh addresses RBAD8, RRAD9-22 can be certainly generated, and an update sequence can be correctly maintained even where the number of memory cells MC refreshed at a time differs between the operation modes SMD, AMD.

When the refresh operations are continuously performed during the auto-refresh mode AMD, parts of the activation periods of the operation control signals CNT including the LE1Z signal, the LE0Z signal overlap each other. Hence, parts of the refresh operation periods overlap each other. Accordingly, also when the refresh operations are performed in the banks BK1, BK0, respectively, in response to one auto-refresh command AREF, the refresh operation period (activation period of the REFZ signal) can be minimized. Consequently, the auto-refresh operation cycle can be shortened, which can prevent the frequency of supply of the read command and the write command from lowering. Namely, a drop in access efficiency can be prevented. Incidentally, the refresh operation periods in the banks BK1, BK0 overlap each other, so that the REFZ signal is activated from the start of the refresh operation in the bank BK1 to the completion of the refresh operation in the bank BK0 (FIG. 6(q)).

Further, as described in FIG. 4, activation timings of the LE1Z, LE0Z signals are generated from the WL1Z, WL0Z signals. Although not particularly shown, parts of activation periods of the WL1Z signal and the WL0Z signal overlap each other as in the case of the LE1Z signal and the LE0Z signal. In other words, the activation timings (rising edges) of the WL1Z signal and the WL0Z signal are shifted from each other. By sequentially starting the refresh operations in the banks BK1, BK0, an increase in peak current during the auto-refresh operation can be prevented. In particular, the high level of the word line WL is generated using the boost voltage. Therefore, by shifting the activation timings of the word lines WL from each other, the capability of the boosting circuit can be prevented from becoming insufficient. In other words, it is unnecessary to form a boosting circuit with a high capability of generating the boost voltage. Accordingly, an increase in the circuit size of the boosting circuit can be prevented, which can prevent an increase in the wiring width of a power supply line connected to the boosting circuit. As a result, an increase in chip size of the FCRAM can be prevented.

Also regarding the second and subsequent auto-refresh commands AREF, the LE1Z signal and the LE0Z signal are sequentially activated in response to the auto-refresh commands AREF, and the refresh operations in the banks BK1, BK0 are performed while overlapping each other. Further, the refresh address generating circuit 20 performs the count operation twice (FIG. 6(r)). By increasing the number of memory cells MC refreshed in response to the auto-refresh command AREF to twice the number of memory cells MC refreshed in response to the self refresh request SREF, the frequency of supply of the auto-refresh command AREF can be reduced. As a result, the frequency of supply of the read command RD and the write command WR can be relatively increased, which can improve the access efficiency of the FCRAM.

Then, after the self-refresh enable command SREN is supplied, the refresh control circuit 16 releases the masking of the self-refresh request SREF. Thus, as described above, with respect to each self refresh request SREF, the refresh bank address RBAD8 is updated, and the self refresh operations in the banks BK1, BK0 are sequentially performed (FIG. 6 (s, t)).

The insertion timing of the auto-refresh operation is controlled by the controller which accesses the FCRAM, so that the auto-refresh operation does not contend with the read operation and the write operation. Namely, the read operation and the write operation are never performed immediately after the auto-refresh operation. Accordingly, the auto-refresh operation time can be designed with a relative margin. Hence, it becomes easy to shift the start timings of the auto-refresh operations in the banks BK0-1 from each other in order to lower the peak current. Consequently, a region to be refreshed in response to one auto-refresh command AREF can be enlarged, and the frequency of supply of the auto-refresh command AREF can be lowered.

Figure 7:
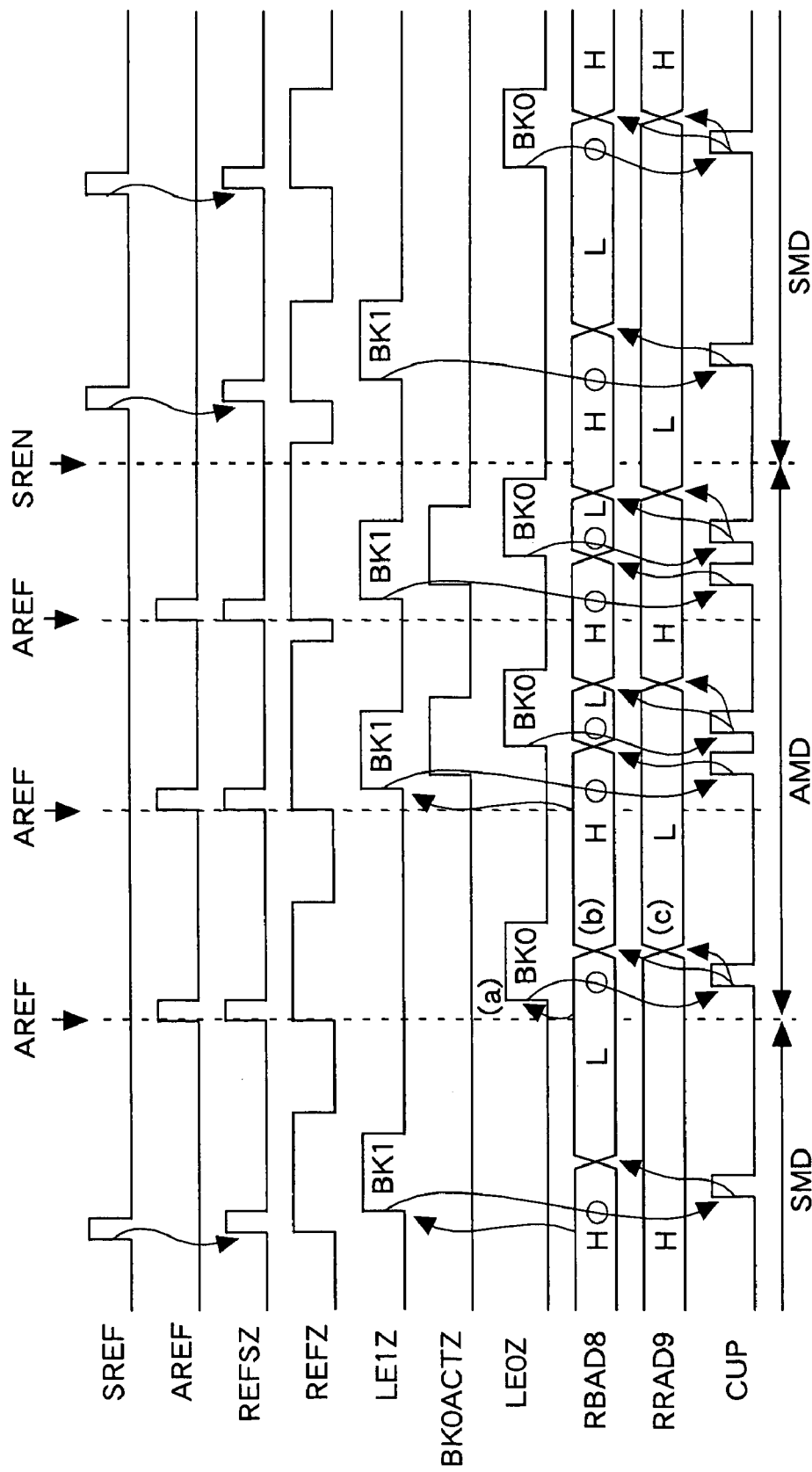
FIG. 7 is a timing chart showing another example of refresh operations in the first embodiment.

FIG. 7 shows another example of refresh operations in the first embodiment. A detailed description of the same operations as in FIG. 6 is omitted. The difference from FIG. 6 is that when the first auto-refresh command AREF is supplied, the refresh bank address RBAD8 of the low logic level L is being outputted. Therefore, the first auto-refresh operation differs from that in FIG. 6. The other operations are the same as those in FIG. 6.

Since the refresh bank address RBAD8 is at the low logic level L, in response to the first auto-refresh command AREF, only the bank control circuit 28 corresponding to the bank BK0 operates to activate the LE0Z signal (FIG. 7(a)). This operation is the same as the self refresh operation when the refresh bank address RBAD8 is at the low logic level L. In FIG. 7, by one refresh operation responsive to the auto-refresh command AREF, the refresh bank address RBAD8 takes a round and changes to the high logic level H (FIG. 7(b)), and the value of the least significant bit RRAD9 of the refresh row address changes (FIG. 7(c)). In this case, in response to the auto-refresh command AREF, only the LE0Z signal is activated. Since the unnecessary refresh operation (refresh operation in the bank BK1 in this case) is not performed, the circuit can be prevented from operating wastefully. Also, it can be prevented that due to the wasteful refresh operation, the counter value of the refresh address generating circuit 30 deviates, thereby causing a malfunction.

By the first auto-refresh operation, the refresh bank address RBAD8 changes to the high logic level H. Therefore, the auto-refresh operations responsive to the second and subsequent auto-refresh commands AREF are the same as those in FIG. 6.

As described above, in the first embodiment, by increasing the number of banks BK (namely, the number of memory cells MC) in which the refresh operation is performed in response to the auto-refresh command AREF compared to the number of banks BK in which the refresh operation is performed in response to the self refresh mode request SREF, the number of auto-refresh commands AREF required to refresh all the memory cells MC can be reduced. Accordingly, the frequency with which the auto-refresh command AREF is supplied to the FCRAM can be lowered, which can improve the access efficiency.

Figure 8:
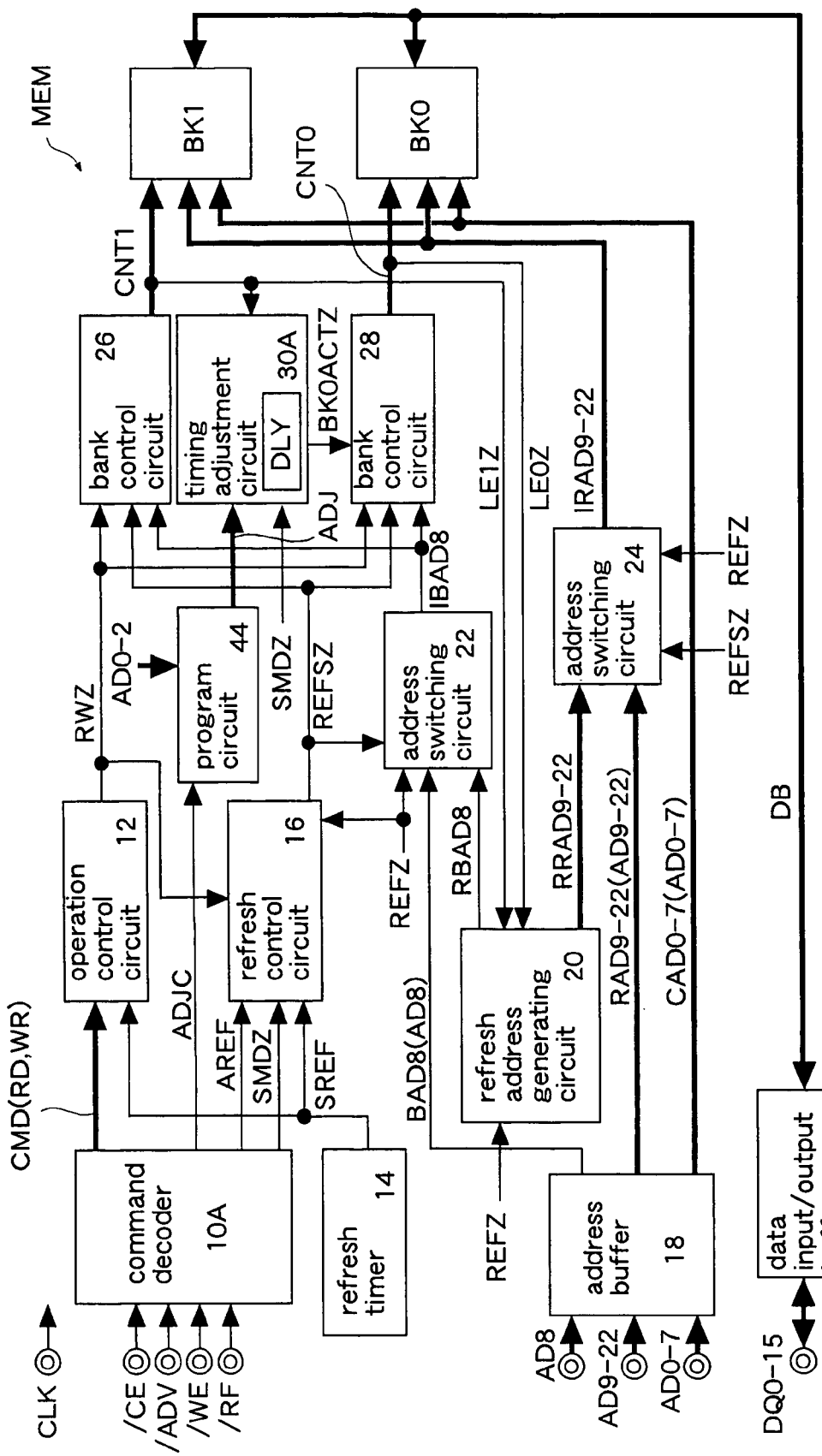
FIG. 8 is a block diagram showing a second embodiment of the present invention.

FIG. 8 shows a second embodiment of the present invention. The same reference symbols are used to designate the same elements as those described in the first embodiment, and a detailed description thereof is omitted. An FCRAM of this embodiment includes a command decoder 10A and a timing adjustment circuit 30A in place of the command decoder and the timing adjustment circuit 30 of the first embodiment. Further, a program circuit 44 is newly formed. The other constitution is the same as in the first embodiment.

The command decoder 10A is constituted by adding a function of receiving an adjustment command ADJC to the command decoder 10 of the first embodiment. The adjustment command ADJC is a test command and used in a fabrication process of the FCRAM. It cannot be used by users who use the FCRAM. The adjustment command ADJC becomes valid, for example, only during a test mode. The test mode is entered by supplying a combination of operation commands which are not usually used by the users to the FCRAM.

Figure 9:
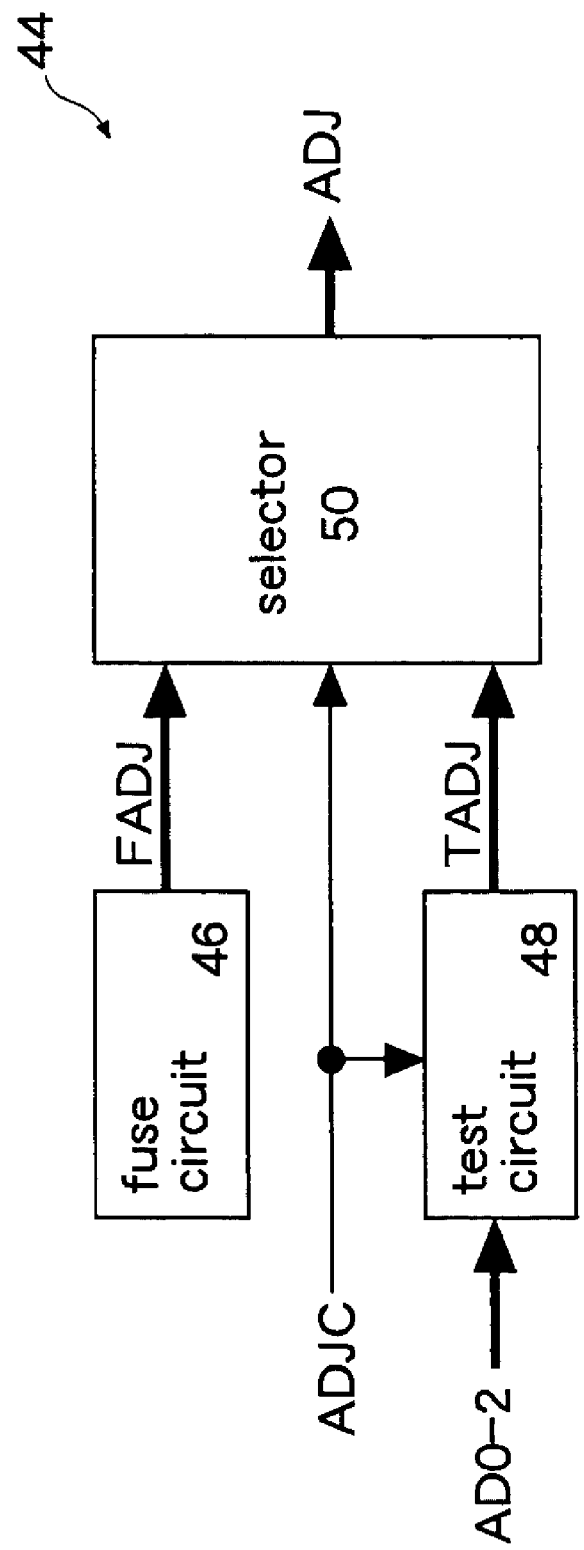
FIG. 9 is a block diagram showing details of a program circuit shown in FIG. 7.

The program circuit 44 receives an address AD0-2 in response to the adjustment command ADJC and stores an adjustment value according to the logic of the address AD0-2. The adjustment value is stored, for example, by a latch or the like, and held only while power is supplied to the FCRAM. Further, as shown in FIG. 9 described later, the program circuit 44 includes a fuse circuit 46 which stores the adjustment value. The program circuit 44 outputs an adjustment signal ADJ with logic according to the stored adjustment value.

The timing adjustment circuit 30A includes a variable delay circuit DLY whose delay time changes according to the adjustment signal ADJ in order to adjust the output timing of the timing signal BK0ACTZ. Thus, the refresh start timing of the bank BK0 in which the refresh operation is performed during the auto-refresh mode AMD can be adjusted.

FIG. 9 shows details of the program circuit 44 shown in FIG. 8. The program circuit 44 includes the fuse circuit 46, a test circuit 48, and a selector 50. The fuse circuit 46 includes plural fuses and outputs an adjustment signal FADJ with logic according to the program state of the fuses. The test circuit 48 receives the address AD0-2 in response to the adjustment command ADJC and stores the adjustment value according to the logic of the address AD0-2. The stored adjustment value is outputted as an adjustment signal TADJ.

When the adjustment command ADJC is valid, that is, during the test mode, the selector 50 outputs the adjustment signal TADJ from the test circuit 48 as the adjustment signal ADJ. Further, when the adjustment command ADJC is invalid, that is, except for the test mode, the selector 50 outputs the adjustment signal FADJ from the fuse circuit 46 as the adjustment signal ADJ.

In this embodiment, first, in the fabrication process, the adjustment command ADJC is made valid, and the FCRAM is evaluated while the value of the adjustment signal ADJ is changed. Then, the start timing of the auto-refresh operation at which the power consumption is within specifications and the auto-refresh operation time is shortest is determined. After this, the fuses to obtain the determined start timing are programmed, and the FCRAM is shipped.

As described above, also in the second embodiment, the same effect as in the above first embodiment can be obtained. Further, in this embodiment, the refresh start timing of the bank BK0 which operates in response to the auto-refresh command AREF can be optimally adjusted. The auto-refresh operation time can be made shortest in a state where the peak current is within specifications. Therefore, the frequency of supply of the read command RD and the write command WR can be relatively increased, which can improve the access efficiency of the FCRAM.

Figure 10:
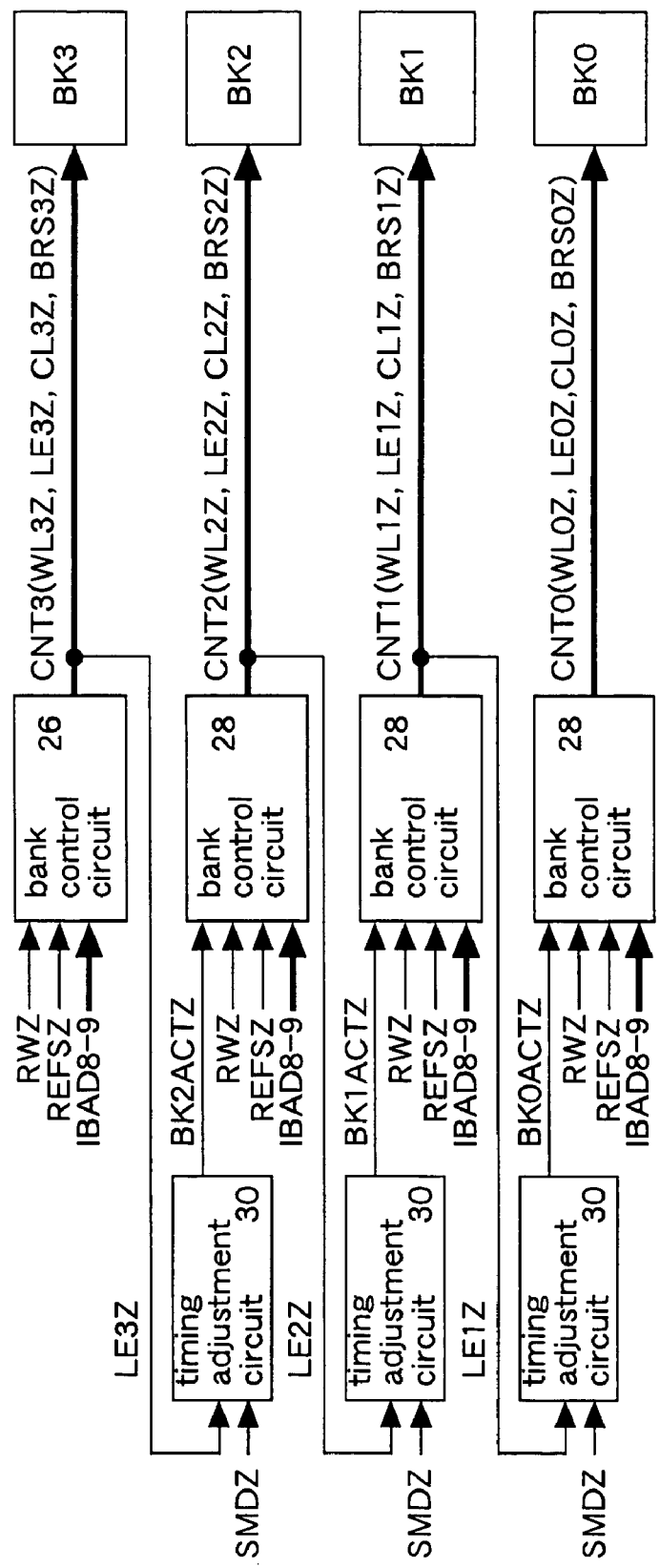
FIG. 10 is a block diagram showing another constitutional example of the present invention.

Incidentally, in the above embodiments, the example in which the present invention is applied to the FCRAM including two banks BK0-1 is described. The present invention is not limited to these embodiments. For example, as shown in FIG. 10, the present invention may be applied to an FCRAM including four banks BK0-3. In this case, the FCRAM includes the bank control circuit 26 corresponding to the bank BK3 and the bank control circuits 28 and the timing adjustment circuits 30 corresponding to the banks BK2-0, respectively.

Numerals of the operation control signals CNT0-3 in this figure each correspond to the number of the bank BK.

Although not particularly shown, low-order two bits of the refresh address generated by the refresh address generating circuit are a refresh bank address RBAD8-9 to select the bank BK0-3. At this time, the refresh row address is RRAD10-22. Therefore, the bank control circuits 26, 28 receive a bank address IBAD8-9. In the refresh operation responsive to the first auto-refresh command AREF, the refresh operation is performed in at least one bank BK selected according to the refresh bank address RBAD8-9. In the refresh operations responsive to the second and subsequent auto-refresh commands AREF, the refresh operations in the banks BK0-3 are sequentially performed while overlapping one another.

Further, in the above embodiments, the example in which the present invention is applied to the FCRAM is described. The present invention is not limited to these embodiments.

For example, the present invention may be applied to a clock synchronous type pseudo SRAM.

In the above embodiments, the example in which the refresh operation in the bank BK0 is started in synchronization with the LE1Z signal of the bank BK1 during the auto-refresh mode AMD is described. The present invention is not limited to these embodiments. For example, the refresh operation in the bank BK0 may be started in synchronization with the WL1Z signal or the CL1Z signal. Alternatively, it is also possible that using a selector similar to the selector 44 shown in the second embodiment, any of the WL1Z signal, the LE1Z signal, and the CL1Z signal can be selected using a fuse circuit.

The invention is not limited to the above embodiments and various modifications may be made without departing from the spirit and scope of the invention. Any improvement may be made in part or all of the components.

What is claimed is:

1. A semiconductor memory, comprising:
   a memory core including memory cells;
   a refresh request generating circuit generating an internal refresh request in a predetermined cycle;
   an external refresh input circuit receiving an external refresh request; and
   a core control circuit outputting operation control signals to said memory core in order to perform refresh operations in response to said internal refresh request and said external refresh request and setting a number of refreshing the memory cells in response to said external refresh request larger than a number of refreshing the memory cells in response to said internal refresh request.

2. The semiconductor memory according to claim 1, wherein
   said memory core is constituted by plural banks operating independently each other, and
   said core control circuit outputs said operation control signals to perform the refresh operations in said banks respectively, outputting the operation control signal to any of said banks in response to said internal refresh request, and outputting said operation control signals to two or more of said banks in response to said external refresh request.

3. The semiconductor memory according to claim 2, further comprising:
   plural word lines formed in each of said banks and each connected to the plural memory cells; and
   a refresh address generating circuit generating an address indicating the bank and a refresh address indicating the word line where the refresh operation is to be performed in response to the operation control signal.

4. The semiconductor memory according to claim 3, wherein
   said refresh address generating circuit comprises:
   a counter control circuit generating a count-up signal in response to the operation control signal; and
   plural binary counters connected in series and receiving said count-up signal at a first stage, wherein
   at least one of lower-side counters outputs a refresh bank address to select said bank and counters other than the counter which outputs the refresh bank address output a refresh row address to select the word line.

5. The semiconductor memory according to claim 4, wherein
   in response to said external refresh request, said core control circuit sequentially outputs said operation control signals, respectively, in synchronization with changes of said refresh bank address until changing a value of a least significant bit of the refresh row address outputted by the refresh address generating circuit.

6. The semiconductor memory according to claim 2, wherein
   the semiconductor memory includes an external refresh mode in which the refresh operation is performed in response to only said external refresh request, and an internal refresh mode in which the refresh operation is performed in response to only said internal refresh request,
   said core control circuit comprises:
   bank control circuits respectively formed corresponding to said banks and outputting said operation control signals in order to perform the refresh operations in two or more of said banks in response to one external refresh request during said external refresh mode; and
   a timing adjustment circuit receiving the operation control signal outputted from a first bank control circuit which is the bank control circuit corresponding to the bank where the refresh operation is performed relatively earlier, and outputting the received operation control signal as a timing signal to a second bank control circuit which is the bank control circuit corresponding to the bank where the refresh operation is performed relatively later, and
   said second bank control circuit outputs its own operation control signal in synchronization with said timing signal.

7. The semiconductor memory according to claim 6, wherein
   each of said banks comprises plural word lines each connected to the plural memory cells, and a sense amplifier amplifying a signal amount of data read from the memory cell in response to selection of one of said word lines,
   said operation control signal includes a word line activating signal to select one of said word lines and a sense amplifier activating signal to activate said sense amplifier, and
   said timing signal is said sense amplifier activating signal.

8. The semiconductor memory according to claim 6, wherein
   said timing adjustment circuit has a function of adjusting an output timing of said timing signal.

9. The semiconductor memory according to claim 8, further comprising
   a program circuit outputting an adjustment signal with logic according to a preset set value, wherein
   said timing adjustment circuit comprises a variable delay circuit allowed to adjust the output timing of said timing signal according to the logic of said adjustment signal.

10. The semiconductor memory according to claim 9, wherein
    said program circuit comprises a fuse and outputs an adjustment signal with logic according to a program state of the fuse.

11. The semiconductor memory according to claim 2, wherein
    when the refresh operations are performed in two or more of said banks in response to said external refresh request, said core control circuit outputs said operation control signals at timings when parts of refresh operation periods overlap each other.

12. The semiconductor memory according to claim 11, further comprising
    plural word lines formed in each of said banks and each connected to the plural memory cells, wherein when the refresh operations responsive to said external refresh request are performed, said core control circuit shifts activation timings of said word lines from each other.

13. The semiconductor memory according to claim 1, further comprising:
a mode switching circuit, when said external refresh request is received during an internal refresh mode, switching said internal refresh mode to an external refresh mode in response to said external refresh request; and
an internal request masking circuit outputting said internal refresh request to said core control circuit during said internal refresh mode and disabling said internal refresh request from being supplied to said core control circuit during said external refresh mode, wherein
said internal refresh mode is an operation mode in which the refresh operation is performed in response to only said internal refresh request, and said external refresh mode is an operation mode in which the refresh operation is performed in response to only said external refresh request.

14. The semiconductor memory according to claim 13, further comprising
a reset circuit outputting a reset signal in response to the switching from said internal refresh mode to said external refresh mode; and
a refresh request storing circuit receiving the internal refresh request outputted from said internal request masking circuit, holding the internal refresh request in response to which the refresh operation is not allowed to be performed due to contention with a read operation or a write operation, outputting the held internal refresh request to said core control circuit while said read operation and said write operation are not performed, and erasing the held internal refresh request in response to the reset signal.

15. The semiconductor memory according to claim 13, further comprising
an external request masking circuit disabling said external refresh request from being outputted to said core control circuit during the refresh operation responsive to said internal refresh request.

16. The semiconductor memory according to claim 1, wherein
said core control circuit outputs said operation control signal to said memory core to perform a read operation or a write operation in response to a read command or a write command,
an external access cycle time being a specification of a minimum supply interval of the read command or the write command is equal to a value obtained by adding a margin time to a core operation time for said memory core to perform one read operation or one write operation, and
the refresh operation responsive to said internal refresh request is performed using said margin time.

* * * * *